United States Patent [19]
Bertness et al.

[11] Patent Number: 6,104,167
[45] Date of Patent: Aug. 15, 2000

[54] METHOD AND APPARATUS FOR CHARGING A BATTERY

[75] Inventors: Kevin I. Bertness, Batavia; Stephen J. McShane, Oak Brook, both of Ill.

[73] Assignee: Midtronics, Inc., Burr Ridge, Ill.

[21] Appl. No.: 09/415,587

[22] Filed: Oct. 8, 1999

Related U.S. Application Data

[62] Division of application No. 08/962,754, Nov. 3, 1997.

[51] Int. Cl.[7] ................................. H02J 7/00; H02J 7/14
[52] U.S. Cl. ..................... 320/132; 320/107; 320/134; 320/162; 320/DIG. 21; 324/427
[58] Field of Search ..................... 324/426, 427, 324/432; 320/107, 132, 162, DIG. 21, 134

[56] References Cited

U.S. PATENT DOCUMENTS

| | | | |
|---|---|---|---|
| 2,514,745 | 7/1950 | Dalzell | 171/95 |
| 3,356,936 | 12/1967 | Smith | 324/29.5 |

(List continued on next page.)

FOREIGN PATENT DOCUMENTS

| | | |
|---|---|---|
| 0 022 450 A1 | 1/1981 | European Pat. Off. . |
| 0 637 754 A1 | 2/1995 | European Pat. Off. . |
| 0 772 056 A1 | 5/1997 | European Pat. Off. . |
| 29 26 716 B1 | 1/1981 | Germany . |
| 59-17892 | 1/1984 | Japan . |
| 59-17893 | 1/1984 | Japan . |
| 59-17894 | 1/1984 | Japan . |
| 60-225078 | 11/1985 | Japan . |
| 03274479 | 12/1991 | Japan . |
| 03282276 | 12/1991 | Japan . |
| 04131779 | 5/1992 | Japan . |
| 04372536 | 12/1992 | Japan . |
| 5216550 | 8/1993 | Japan . |
| 2 088 159 | 6/1982 | United Kingdom . |
| WO 98/58270 | 12/1938 | WIPO . |
| WO 93/22666 | 11/1993 | WIPO . |

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368. (No Month).

"A Look at the Impedance of a Cell", by S. Debardelaben, *IEEE*, 1988, pp. 394–397. (No Month).

"The Impedance of Electrical Storage Cells", by N.A. Hampson et al., *Journal of Applied Electrochemistry*, 1980, pp. 3–11. (No Month).

"A Package for Impedance/Admittance Data Analysis", by B. Boukamp, *Solid State Ionics*, 1986, pp. 136–140. (No Month).

"Precision of Impedance Spectroscopy Estimates of Bulk, Reaction Rate, and Diffusion Parameters", by J. Macdonald et al., *J. Electroanal, Chem.*, 1991, pp. 1–11. (No Month).

(List continued on next page.)

*Primary Examiner*—Shawn Riley
*Assistant Examiner*—Gregory J. Toatley, Jr.
*Attorney, Agent, or Firm*—Westman, Champlin & Kelly, P.A.

[57] ABSTRACT

An apparatus for charging a battery includes a first electrical connection adapted to connect to a positive terminal of the battery and a second electrical connector adapted to connect to a negative terminal of the battery. An electrical charging source couples to the first and second electrical connectors to charge the battery. Voltage measurement circuitry couples to the first and second electrical connectors and responsively provides a voltage output related to voltage across the battery. Current measurement circuitry also couples to the first and second electrical connectors and responsively provides a current output related to electrical current through the battery. State of charge measurement circuitry responsively provides a state of charge output as a function of the voltage output and the current output.

34 Claims, 5 Drawing Sheets

U.S. PATENT DOCUMENTS

| | | | |
|---|---|---|---|
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Strezelewicz | 324/170 |
| 3,873,911 | 3/1975 | Champlin | 324/430 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 429/431 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,390,828 | 6/1983 | Converse et al. | 320/153 |
| 4,392,101 | 7/1983 | Saar et al. | 320/20 |
| 4,396,880 | 8/1983 | Windebank | 320/156 |
| 4,408,157 | 10/1983 | Beaubien | 324/62 |
| 4,412,169 | 10/1983 | Dell'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,816,768 | 3/1989 | Champlin | 324/429 |
| 4,820,966 | 4/1989 | Fridman | 320/32 |
| 4,825,170 | 4/1989 | Champlin | 324/426 |
| 4,849,700 | 7/1989 | Morioka et al. | 324/427 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,931,738 | 6/1990 | MacIntyre et al. | 324/435 |
| 4,947,124 | 8/1990 | Hauser | 324/430 |
| 4,956,597 | 9/1990 | Heavey et al. | 320/14 |
| 4,968,941 | 11/1990 | Rogers | 324/428 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,248 | 9/1992 | Alexandres et al. | 324/428 |
| 5,170,124 | 12/1992 | Blair et al. | 324/434 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,295,078 | 3/1994 | Stich et al. | 364/483 |
| 5,298,797 | 3/1994 | Redl | 307/246 |
| 5,300,874 | 4/1994 | Shimamoto et al. | 320/106 |
| 5,331,268 | 7/1994 | Patino et al. | 320/20 |
| 5,336,993 | 8/1994 | Thomas et al. | 324/158.1 |
| 5,343,380 | 8/1994 | Champlin | 363/46 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,426,371 | 6/1995 | Salley et al. | 324/429 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Matsumoto et al. | 320/20 |
| 5,449,997 | 9/1995 | Gilmoer et al. | 320/39 |
| 5,457,377 | 10/1995 | Jonsson | 320/5 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,585,728 | 12/1996 | Chammplin | 324/427 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |
| 5,650,937 | 7/1997 | Bounaga | 364/483 |
| 5,652,501 | 7/1997 | McClure et al. | 320/17 |
| 5,675,234 | 10/1997 | Greene | 320/15 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,717,336 | 2/1998 | Basell et al. | 324/430 |
| 5,757,192 | 5/1998 | McShane et al. | 324/427 |
| 5,773,978 | 6/1998 | Becker | 324/430 |
| 5,789,899 | 8/1998 | van Phuoc et al. | 320/30 |
| 5,793,359 | 8/1998 | Ushikubo | 345/169 |
| 5,821,756 | 10/1998 | McShane et al. | 324/430 |
| 5,831,436 | 11/1998 | Troy | 324/426 |
| 5,872,433 | 2/1999 | Wiliamson | 320/139 |
| 5,914,605 | 6/1999 | Bertness | 324/430 |
| 5,945,829 | 8/1999 | Bertness | 324/430 |

OTHER PUBLICATIONS

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131. (No Month).

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

METHOD AND APPARATUS FOR CHARGING A BATTERY

This is a Divisional application of U.S. patent application Ser. No. 08/962,754, filed Nov. 3, 1997 is still pending.

BACKGROUND OF THE INVENTION

The present invention relates to rechargeable storage batteries. More specifically, the present invention relates to battery chargers of the type used to charge such batteries.

Chemical batteries which create electricity from chemical reactions have been known for many years. Such batteries are becoming increasing important and have found uses throughout industry. These uses include automobiles, UPS systems, etc.

One advantage of chemical batteries, such as lead acid storage batteries, is that they can be charged and their chemical process reversed by forcing electricity through the battery. Charging systems are widely known in the art and are widely available in the consumer market.

One of the most common techniques for recharging storage batteries is simply placing a voltage source across the battery having a voltage which is greater than the battery voltage. The voltage difference will cause a charging current to flow through the battery causing a reversal of the chemical reaction. The charging current decreases as the voltage difference between the charging voltage and the battery voltage decreases. Typically, the charging voltage is selected to be greater than the nominal battery voltage in order to cause a slight overcharge of the battery. The battery is deemed to be "charged" when the battery will accept no additional current. Frequently, this is through a simple visual inspection of an amp meter on the battery charger by the user of the battery charger. The battery charger may then be switched off.

However, such a simple technique for recharging a battery, although inexpensive, does not provide optimum battery charging and provides very little information about the battery itself. The device does not permit optimal rapid charging of the battery and may lead to excessive overcharging of the battery that can permanently damage the battery and even lead to boiling of the battery electrochemicals causing an unsafe environment. On the other hand, undercharging of a battery results in a battery that is not capable of providing its full potential output. These problems are exacerbated in situations where the battery is rapidly charged using large charging currents.

U.S. Pat. No. 4,956,597, issued Sep. 11, 1990 to Heavey et al. and is assigned to American Monarch Corporation, and entitled "METHOD AND APPARATUS FOR CHARGING BATTERIES" describes one technique in which battery voltage is monitored in an attempt to determine when a battery is fully charged. Another example is shown in U.S. Pat. No. 5,642,031, entitled BATTERY RECHARGING SYSTEM WITH STATE OF CHARGE DETECTION THAT INITIALLY DETECTS WHETHER A BATTERY TO BE CHARGED IS ALREADY AT OR NEAR FULL CHARGE TO PREVENT OVERCHARGING, issued Jun. 24, 1997 to Brotto. The Brotto patent describes a technique in which the charging current is periodically pulsed and the voltage decay is monitored.

SUMMARY OF THE INVENTION

An apparatus for charging a battery includes a first electrical connection adapted to connect to a positive terminal of the battery and a second electrical connector adapted to connect to a negative terminal of the battery. An electrical charging source couples to the first and second electrical connectors to charge the battery. Voltage measurement circuitry couples to the first and second electrical connectors and responsively provides a voltage output related to voltage across the battery. Current measurement circuitry also couples to the first and second electrical connectors and responsively provides a current output related to electrical current through the battery. State of charge measurement circuitry responsively provides a state of charge output as a function of the voltage output and the current output. One aspect of the invention includes a state of charge output which increases as impedance decreases (and decreases as admittance increases) as determined by the voltage and current outputs. Another aspect of the invention includes battery rating storage circuitry which stores a rating related to the battery in a fully charged condition and the state of charge output is a function of a measured state of charge and the battery rating. This may be expressed, for example, as a percentage charge.

DETAILED DESCRIPTION OF THE PREFERRED EMBODIMENTS

The present invention provides an apparatus for charging a battery which is also capable of monitoring the condition of the battery. Such monitoring can be used to provide information to an operator, or to provide feedback to control the charging. The invention uses the charging current and voltage themselves to advantageously determine battery condition. Thus, a battery charger in accordance with the present invention is capable of determining the status of the battery, making advanced decisions about charging the battery and selecting a particular charging profile used in such charging.

Figure 1:
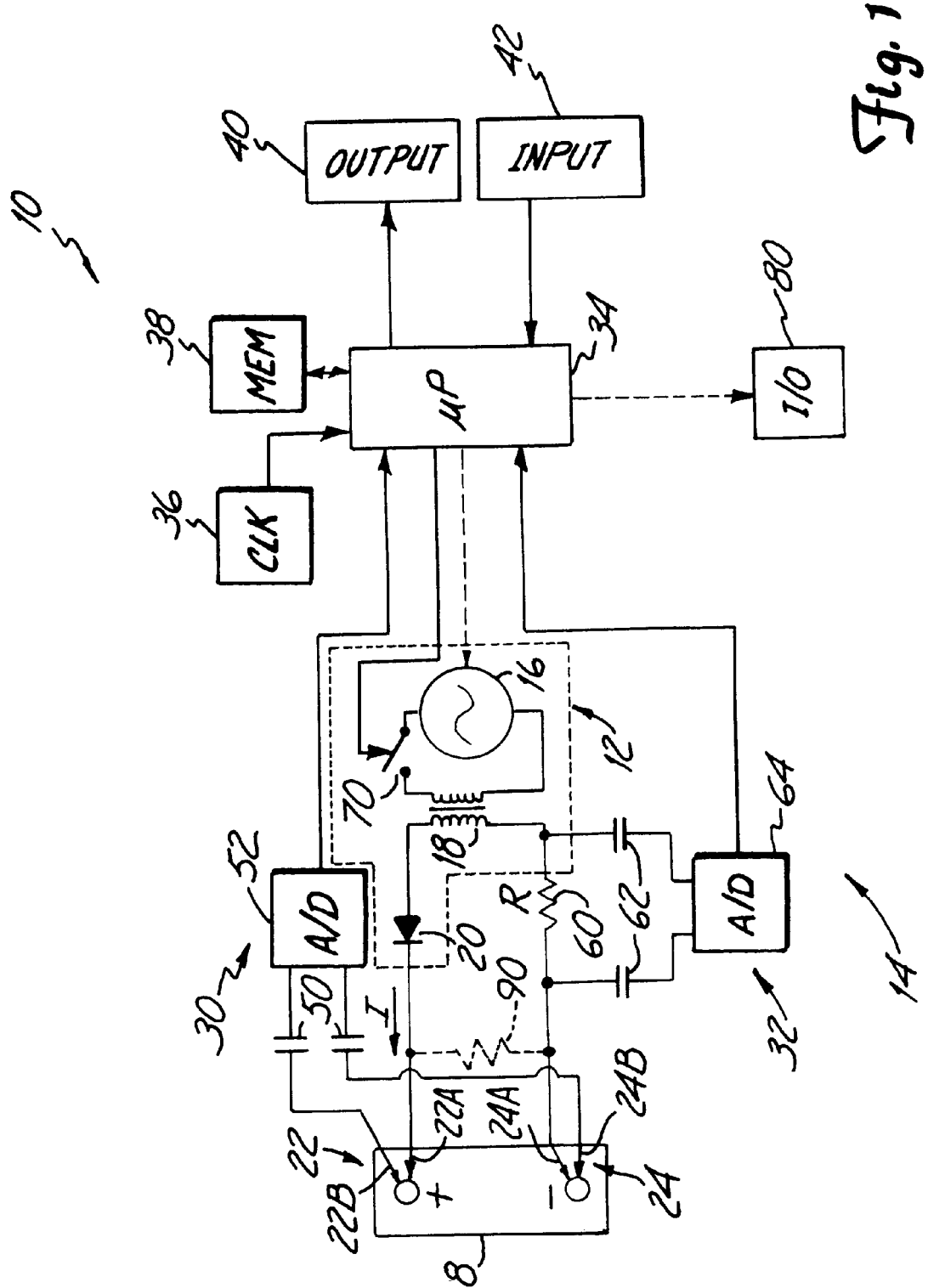
FIG. 1 is a simplified block diagram of a battery charging system in accordance with the present invention.

FIG. 1 is a simplified block diagram of a battery charging system 10 in accordance with the present invention coupled to storage battery 8. System 10 includes battery charger circuitry 12 and test circuitry 14. Battery charge circuitry 12 generally includes AC source 16, transformer 18 and rectifier 20. System 10 couples to battery 8 through electrical connection 22 which couples to the positive terminal of battery 8 and electrical connection 24 which couples to the negative terminal of battery 8. In one preferred embodiment, a four point (or Kelvin) connection technique is used in which battery charge circuitry 12 couples to battery 8 through electrical connections 22A and 24B while battery testing circuitry 14 couples to battery 8 through electrical connections 22A and 24B.

Battery testing circuitry 14 includes voltage measurement circuitry 30 and current measurement circuitry 32 which provide outputs to microprocessor 34. Microprocessor 34 also couples to a system clock 36 and memory 38 which is used to store information and programming instructions. In the embodiment of the invention shown in FIG. 1, microprocessor 34 also couples to user output circuitry 40 and user input circuitry 42.

Voltage measurement circuitry 30 includes capacitors 50 which couple analog to digital converter 52 to battery 8 through electrical connections 22B and 24B. Any type of coupling mechanism may be used for element 50 and capacitors are merely shown as one preferred embodiment. Further, the device may also couple to DC signals. Current measurement circuitry 32 includes a shunt resistor (R) 60 and coupling capacitors 62. Shunt resistor 60 is coupled in series with battery charging circuitry 12. Other current measurement techniques are within the scope of the invention including Hall-Effect sensors, magnetic or inductive coupling, etc. An analog to digital converter 64 is connected across shunt resistor 60 by capacitors 62 such that the voltage provided to analog to digital converter 64 is proportional to an AC portion of current I flowing through battery 8 due to charging circuitry 12. Analog to digital converter 64 provides a digitized output representative of this current to microprocessor 34.

During operation, AC source 16 is coupled to battery 8 through transformer 18 and rectifier 20. Rectifier 20 provides half way rectification such that current I has a non-zero DC value. Of course, full wave rectification or other AC sources may also be used. Analog to digital converter 64 provides a digitized output to microprocessor 34 which is representative of current I flowing through battery 8. Similarly, analog to digital converter 52 provides a digitized output representative of the voltage across the positive and negative terminals of battery 8. Analog to digital converters 52 and 64 are capacitively coupled to battery 8 such that they measure the AC components of the charging signal.

Microprocessor 34 determines the conductance of battery 8 based upon the digitized current and voltage information provided by analog to digital converters 64 and 52, respectively. Microprocessor 34 calculated the conductance of battery 8 as follows:

$$\text{Conductance} = G = \frac{I}{V}, \qquad \text{Eq. 1}$$

where I is the AC charging current and V is the AC charging voltage across battery 8. Note that in one preferred embodiment the Kelvin connections allow more accurate voltage determination because these connections do not carry substantial current to cause a resultant drop in the voltage measured.

In accordance with the present invention, the battery conductance is used to monitor charging of battery 8. Specifically, it has been discovered that as a battery is charged the conductance of the battery rises. This rise which can be used as feedback to the charger in conductance can be monitored in microprocessor 34 to determine when the battery has been fully charged. For example, if the rate of the rise in conductance slowly decreases, such that the conductance reaches a substantially constant value, microprocessor 34 determines that battery 8 is fully charged and disconnects charging circuitry 12 using switch 70. Further, in one aspect of the present invention, microprocessor 34 responsively controls the rate of charge by adjusting AC source 16 to reduce the likelihood that battery 8 is damaged by significant overcharge.

Figure 2:
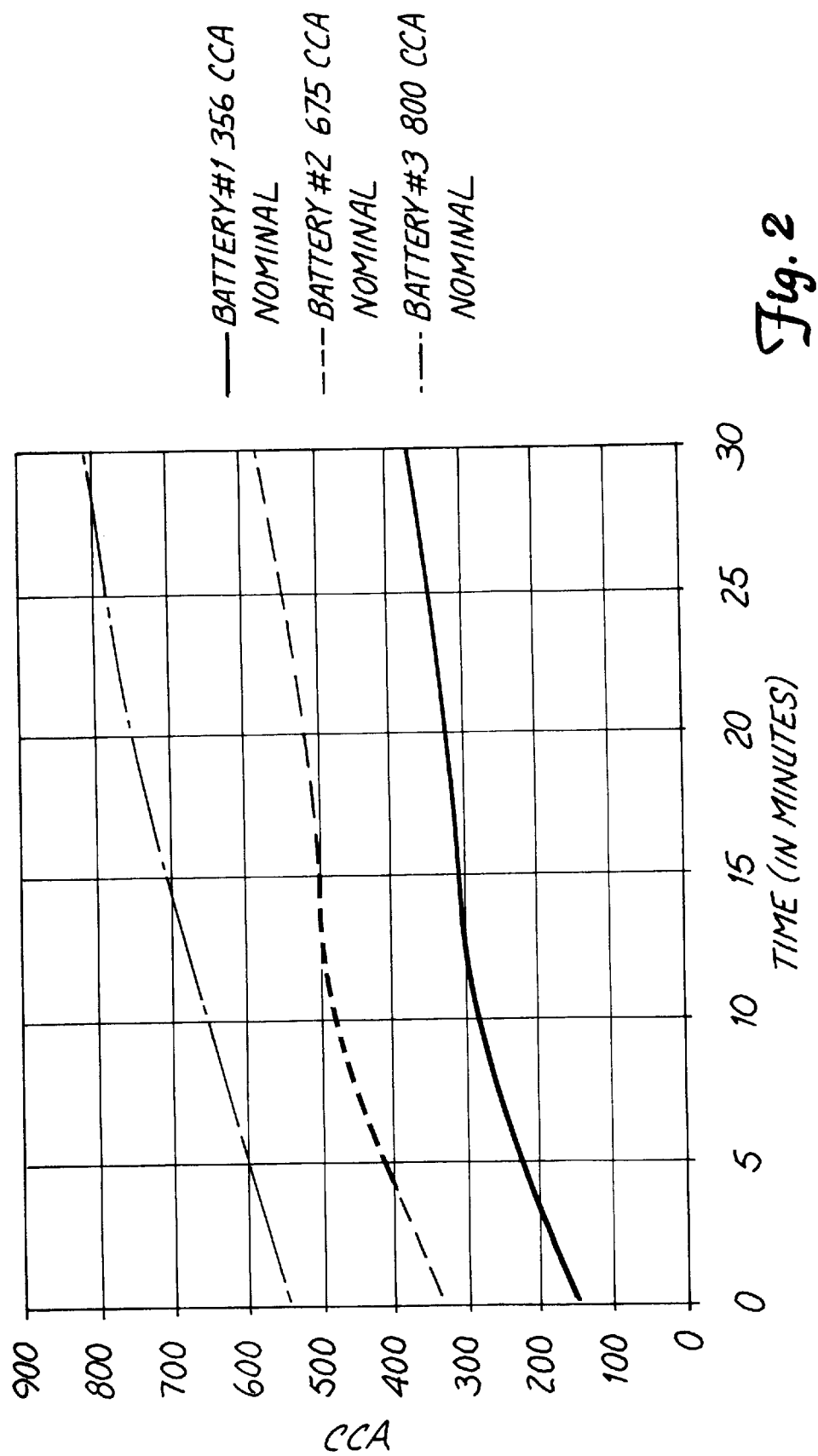
FIG. 2 is a graph of CCA versus time.

Furthermore, microprocessor 34 can calculate cold cranking amps (CCA) of battery 8 using the formula:

$$CCA = K \cdot G \qquad \text{Eq. 2}$$

where K is constant which may be selected for a specific battery and G is given in Equation 1. FIG. 2 is a graph of CCA versus time in minutes for three different batteries having three different nominal CCA ratings. This particular graph shows that after about 25 to 30 minutes, each battery has reached its nominal CCA rating.

Figure 3:
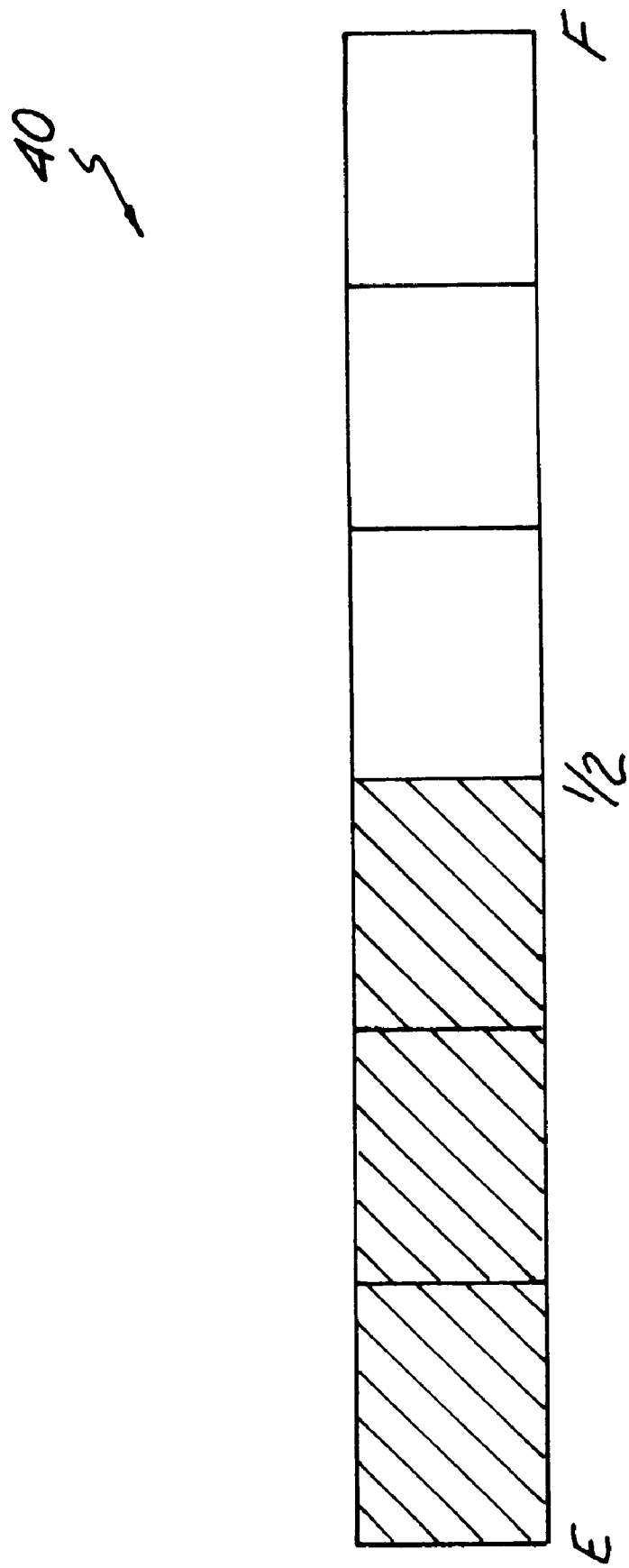
FIG. 3 shows an output display in accordance with one embodiment of the present invention.

One aspect of the invention includes storing information in microprocessor 34 or memory 38 which relates to battery 8. For example, this information could be the battery's nominal CCA rating as input through input 42 by an operator. Further, the make and model of the battery may be input by an operator through input 42 and information related to that specific battery type recovered from memory 38. In general, the rating of the battery may be input in the form of CCA, amp hours, RC, JIS number, stock number, battery construction or chemistry, etc. For example, if a nominal or reference conductance ($G_{REFERENCE}$) is stored in memory, a relative conductance determination can be made by microprocessor 34 using the equation:

$$\text{Relative Conductance}(\%) = \frac{G_{measured}}{G_{reference}} \times 100, \qquad \text{Eq. 3}$$

where $G_{measured}$ is the battery conductance in accordance with Equation 1. Generally, this reference conductance is determined based upon type and characteristics of battery 8. This technique is described in U.S. Pat. No. 5,140,269, entitled ELECTRONIC TESTER FOR ASSESSING BATTERY/CELL CAPACITY, issued Aug. 18, 1992 to Champlin. This may be converted into a display for output on output 40 such that an operator may monitor the charging of battery 8. For example, FIG. 3 shows one embodiment of output 40 in which a bar graph is provided with indications for "empty" and "full." In the embodiment shown in FIG. 3, a half reading "full" is shown. This may be implemented through an LED display, for example. Other examples of desirable outputs include outputs which appear as a gauge or other visual indication of the battery condition. Other types of outputs include outputs indicating the recovering of amp hours, state of charge, reserve capacity, time to full charge or run time remaining. This may be shown in percentages, numerically, graphically, etc.

Figure 4:
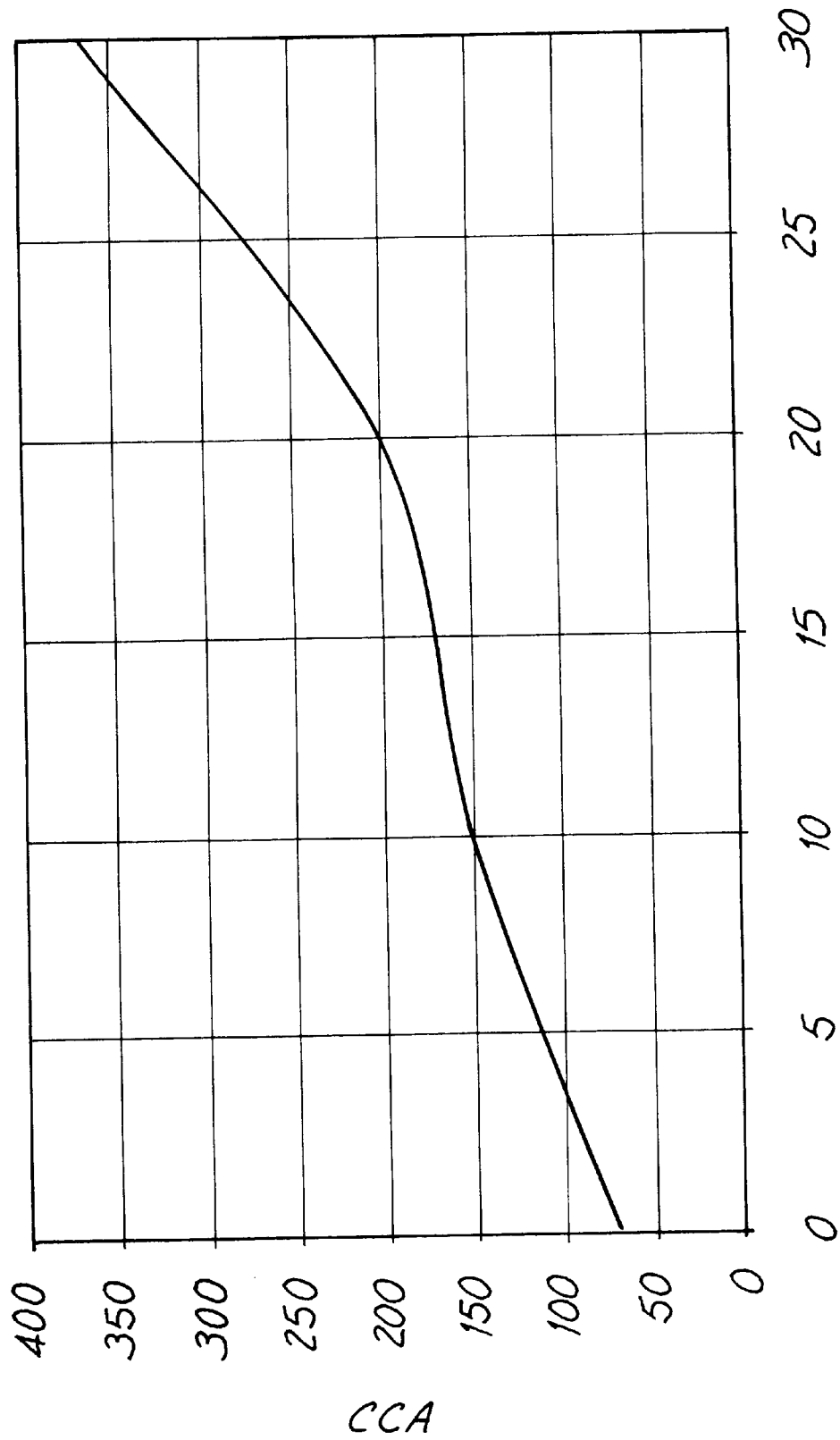
FIG. 4 is a graph of CCA versus time for a battery with a bad cell.
Figure 5:
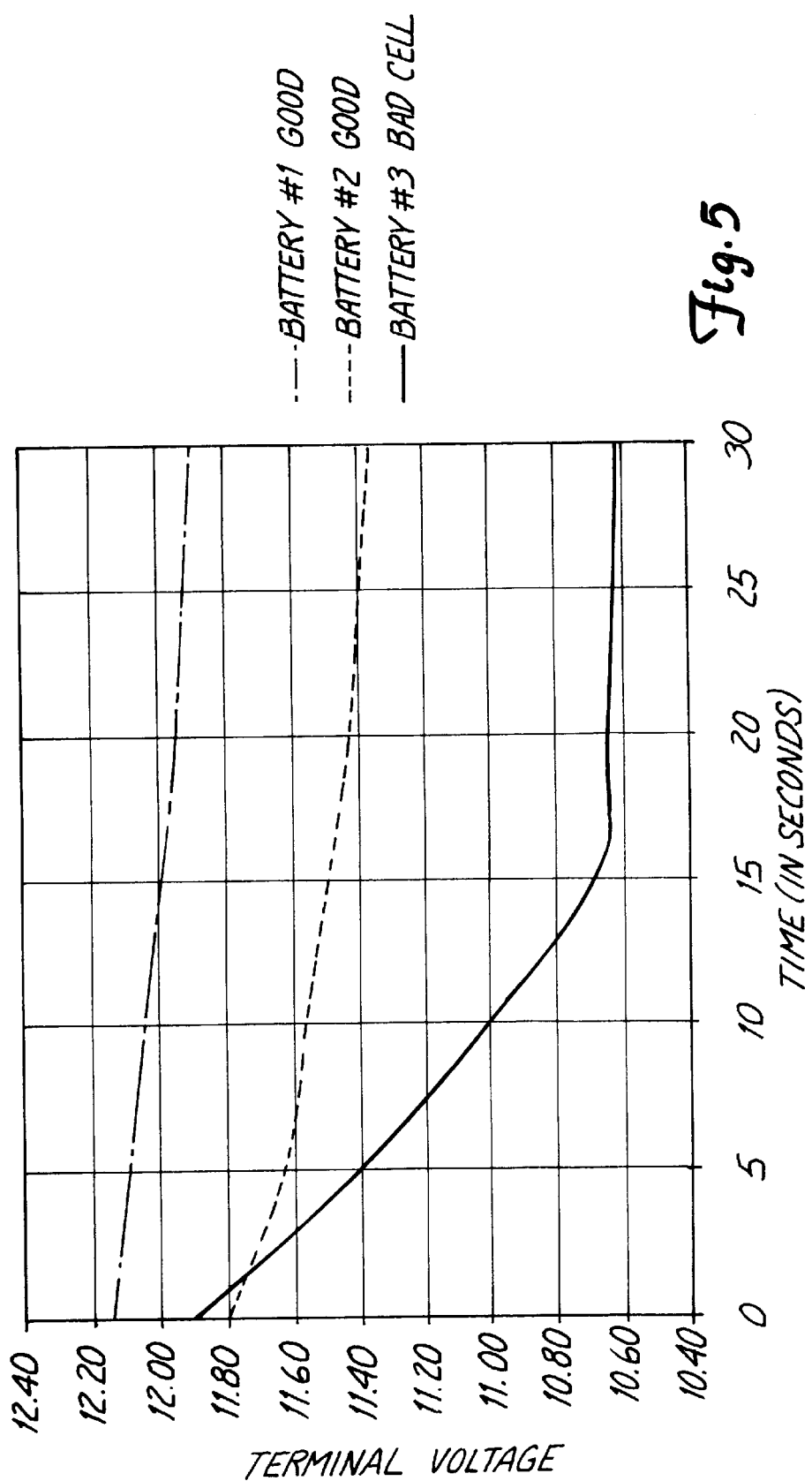
FIG. 5 is a graph of terminal voltage versus time for three batteries under a load test.

One general aspect of the present invention includes a technique for providing feedback control of a battery charger where the feedback control is a function of charging voltage and charging current. In one embodiment, bad cells or shorted cells are detected when the rate of change of the conductance is greater than a predetermined threshold. For example, FIG. 4 is a graph of CCA versus time for a battery (nominal conductance of 500 CCA) being charged in accordance with the invention which developed a bad cell during testing. The graph of FIG. 4 shows an abnormal change in conductance in comparison to the graphs of FIG. 2. This can be used to control the charging rate, or to stop the charging rate and give a fault indication using output 40. Further, an initial load test may be applied to the battery using load resistance 90 to determine if there is a bad cell by observing a resultant decline in voltage versus time using voltage measurement circuitry 30. This is illustrated in the graph of FIG. 5 which shows battery terminal voltage versus time for two good batteries and one battery with a bad cell. Further, other diagnostics may be performed such as those described in U.S. Pat. No. 5,574,355, entitled METHOD AND APPARATUS FOR DETECTION AND CONTROL OF THERMAL RUNAWAY IN A BATTERY UNDER CHARGE, issued Nov. 12, 1996 to McShane et al.

The present invention advantageously uses the charging current and voltage to determine the condition of the battery.

This allows for continuous testing during battery charging and the battery charger does not need to be taken off line. Further, the measurement is not adversely affected by electrical noise in the system.

Another aspect of the present invention includes an I/O port or link 80 which is adapted to be coupled to an external device, such as an external battery tester, printer, storage device, automotive analysis device, etc. This may be a physical link, or, in one embodiment, this I/O link is through an infrared (IR), radio frequency (RF), or ultrasonic connection such that a physical link between the two units is not necessary. For example, the results from a previously performed battery test can be supplied to system 10 by a separate battery tester, whereby the initial condition of battery 6 is used during charging. Similarly, an external or separate device can communicate information such as the model number or type of battery being charged.

The present invention advantageously uses a Kelvin connection in which the electrical connection to the battery includes two connections for charging and two connections for a separate voltage measurement.

Additionally, during charging, the rate of increase of the voltage may be selectively monitored to determine charging efficiency and other characteristics of the battery.

One type of output that can be provided on output 40 includes various types of auditing codes as those set forth in co-pending application Ser. No. 08/681,730, entitled "METHOD AND APPARATUS FOR AUDITING A BATTERY TEST", filed Jul. 29, 1996 which is commonly assigned with the present application. Additional codes include the sequence code which can indicate the order in which tests were made on an individual battery tester or a time code which indicates the date and time at which a test was made.

In general, although the formulas and techniques set forth herein discuss determination of conductance, the present invention may also be applied to impedance measurements, resistance measurements or admittance measurements of the storage battery. Further, although a microprocessor and digital circuitry is disclosed herein, the present invention may also be implemented in analog circuitry. In general, various techniques for measuring battery conductance are shown in a number of patents including, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. 4,322,685, issued Mar. 30, 1982, entitled AUTOMATIC BATTERY ANALYZER INCLUDING APPARATUS FOR DETERMINING PRESENCE OF SINGLE BAD CELL; U.S. Pat. No. 5,343,380, issued Aug. 30, 1994, entitled "METHOD AND APPARATUS FOR SUPPRESSING TIME VARYING SIGNALS IN BATTERIES UNDERGOING CHARGING OR DISCHARGING"; U.S. Pat. No. 5,572,136, issued Nov. 5, 1996, entitled "ELECTRONIC BATTERY TESTER WITH AUTOMATIC COMPENSATION FOR LOW STATE-OF-CHARGE"; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE"; U.S. Pat. No. 5,585,728, issued Dec. 17, 1996, entitled "ELECTRONIC BATTERY TESTER WITH AUTOMATIC COMPENSATION FOR LOW STATE-OF-CHARGE"; U.S. Pat. No. 5,598,098, issued Jan. 28, 1997, entitled "ELECTRONIC BATTERY TESTER WITH VERY HIGH NOISE IMMUNITY"; and U.S. Pat. No. 5,592,093, issued Jan. 7, 1997, entitled "ELECTRONIC BATTERY TESTING DEVICE LOOSE TERMINAL CONNECTION DETECTION VIA A COMPARISON CIRCUIT".

Although the present invention has been described with reference to preferred embodiments, workers skilled in the art will recognize that changes may be made in form and detail without departing from the spirit and scope of the invention. The various voltages and currents measured herein are set forth as alternating signals and their measurements may be through RMS values, peak-to-peak measurements, etc. However, other techniques may be employed and DC signals may also be monitored. In a typical battery charger, the AC component of the charging signal is related to the line frequency and thus, in the United States, is typically 60 Hz or 120 Hz. However, other frequencies may also be employed. Further, the charge signal may be a stepped DC signal and the voltage and current measurement circuitry responsive to step DC signals. In general, the invention determines battery and/or charging conditions based upon a ratio of charging voltage and charging current.

What is claimed is:

1. An apparatus for charging a battery, comprising:
   a first positive electrical connector to couple to a positive terminal of the battery and carry an electrical signal;
   a second positive electrical connector to couple to the positive terminal of the battery and carry an electrical signal;
   a first negative electrical connector to couple to a negative terminal of the battery and carry an electrical signal;
   a second negative electrical connector to couple to the negative terminal of the battery and carry an electrical signal;
   an electrical charging source to provide a charge signal to the first negative connector and the first positive connector to thereby charge the battery; and
   battery test circuitry operably coupled to the first negative connector, the second negative connector, the first positive connector, and the second positive connector, the battery test circuitry having an output related to cold cranking amps (CCA) of the battery as a function of the electrical signals carried by the first negative connector, second negative connector, first positive connector and second positive connector.

2. The apparatus of claim 1 wherein the battery test circuitry includes a microprocessor.

3. The apparatus of claim 1 wherein the first positive and first negative connectors carry a voltage signal, the second positive and second negative connectors carry a current signal and the cold cranking amp output is a function of the voltage and current signals.

4. The apparatus of claim 3 wherein the cold cranking amp output is a function of battery conductance.

5. The apparatus of claim 1 wherein the cold cranking amp output is a function of battery conductance.

6. The apparatus of claim 1 wherein the charge signal includes an AC component.

7. The apparatus of claim 6 wherein the charge signal comprises an AC signal.

8. The apparatus of claim 1 wherein the cold cranking amp output is displayed in a graphical form.

9. The apparatus of the 8 wherein the graph comprises a bar graph.

10. The apparatus of claim 8 wherein the graph comprises a full/empty graph.

11. The apparatus of claim 3 wherein the cold cranking amp output is a function of AC components of the current signal and the voltage signal.

12. The apparatus of claim 1 wherein the battery test circuitry includes:
    voltage measurement circuitry coupled to the first positive electrical connector and first negative electrical connector to responsively provide a measured voltage output related to a voltage between the first positive and first negative connectors;
    current measurement circuitry coupled to the second positive electrical connector and second negative electrical connector to responsively provide a measured current output related to a current through the second positive and second negative connectors; and
    cold cranking amp measurement circuitry responsively providing the cold cranking amp output as a function of the measured voltage output and the measured current output.

13. The apparatus of claim 1 wherein the battery test circuitry includes battery rating storage circuitry to store a rating related to the battery in a fully charged condition and wherein the apparatus provides a state of charge output as a function of cold cranking amp output and the stored battery rating.

14. The apparatus of claim 13 wherein the state of charge output comprises a percentage.

15. The apparatus of claim 12 wherein the current measurement circuitry includes a resistor in series with the electrical charging source to generate a voltage drop.

16. The apparatus of claim 12 wherein the cold cranking amp output is a function of the measured current output divided by the measured voltage output.

17. The apparatus of claim 1 wherein the charge signal from the electrical charging source is responsive to the cold cranking amp output from the battery test circuitry to thereby control charging of the battery.

18. The apparatus of claim 12 including input circuitry adapted to receive an input related to battery rating for storage in the battery rating storage circuitry.

19. The apparatus of claim 18 wherein the input is a user input.

20. The apparatus of claim 18 wherein the input is selected from the group of inputs consisting of battery make, battery model, battery type, battery part number and battery rating.

21. The apparatus of claim 13 wherein the battery rating storage circuitry is adapted to store a cold cranking amp rating.

22. A method of testing a storage battery while charging the storage battery, comprising:
    applying a charge signal to a positive and negative terminal of the battery through a first connector coupled to the positive terminal and a second connector coupled to the negative terminal, the charge signal including an AC component;
    measuring an AC current component of the charge signal flowing through the first and second connectors;
    measuring an AC voltage component of the charge signal using a third connector coupled to the positive terminal and a fourth connector coupled to the negative terminal, the AC voltage component measured between the third and fourth terminals; and
    determining cold cranking amps (CCA) for the battery as a function of ratio of the measured AC voltage component and the measured AC current component.

23. The method of claim 22 wherein determining cold cranking amps is a function of battery conductance.

24. The method of claim 22 including displaying the cranking amps for the battery.

25. The method of claim 24 wherein displaying the cold cranking amps includes displaying a graph.

26. The method of claim 22 including comparing the determined cold cranking amps with a stored rating for the storage battery.

27. The method of claim 26 including providing a state of charge output based upon the comparison.

28. The method of claim 22 including controlling the charge signal based upon the determined cold cranking amps.

29. The method of claim 22 wherein determining cold cranking amps for the battery includes determining battery conductance.

30. The method of claim 22 including displaying cold cranking amps in a graphical form.

31. The method of claim 22 including comparing the determined cold cranking amps to a rated cold cranking amps for the battery.

32. The method of claim 22 including controlling the charge signal as a function of the determined cold cranking amps.

33. The method of claim 22 including receiving an input related to a rating of the storage battery.

34. The method of claim 22 wherein determining includes dividing the measured AC current component by the measured AC voltage component.

* * * * *

UNITED STATES PATENT AND TRADEMARK OFFICE
CERTIFICATE OF CORRECTION

PATENT NO. : 6,104,167
DATED : August 15, 2000
INVENTOR(S) : Kevin I. Bertness et al.

It is certified that error appears in the above-identified patent and that said Letters Patent is hereby corrected as shown below:

Title page,
Item [56], References Cited,
U.S. PATENT DOCUMENTS, add the following --
5,281,919   1/1994   Pallanisamy . . . 324/427
5,281,920   1/1994   Wurst . . . . . . .. 324/430
5,302,902   4/1994   Groehl . . . . . . ..324/434

Column 3,
Line 37, change "calculated" to -- calculates --.

Signed and Sealed this

Eleventh Day of December, 2001

Attest:

NICHOLAS P. GODICI
*Attesting Officer*    *Acting Director of the United States Patent and Trademark Office*